(12) United States Patent
Jeanroy et al.

(10) Patent No.: US 9,631,929 B2
(45) Date of Patent: Apr. 25, 2017

(54) INERTIAL SENSOR WITH NESTED SEISMIC MASSES AND METHOD FOR MANUFACTURING SUCH A SENSOR

(71) Applicant: SAFRAN ELECTRONICS & DEFENSE, Boulogne Billancourt (FR)

(72) Inventors: Alain Jeanroy, Boulogne Billancourt (FR); Philippe Onfroy, Boulogne Billancourt (FR)

(73) Assignee: Safran Electronics & Defense, Boulogne Billancourt (FR)

( * ) Notice: Subject to any disclaimer, the term of this patent is extended or adjusted under 35 U.S.C. 154(b) by 0 days.

(21) Appl. No.: 15/037,532

(22) PCT Filed: Oct. 21, 2014

(86) PCT No.: PCT/EP2014/072581
§ 371 (c)(1),
(2) Date: May 18, 2016

(87) PCT Pub. No.: WO2015/074818
PCT Pub. Date: May 28, 2015

(65) Prior Publication Data
US 2016/0273916 A1    Sep. 22, 2016

(30) Foreign Application Priority Data
Nov. 20, 2013 (FR) ...................... 13 61434

(51) Int. Cl.
*G01C 19/574* (2012.01)
*G01C 19/5769* (2012.01)
(Continued)

(52) U.S. Cl.
CPC .......... *G01C 19/574* (2013.01); *B81B 3/0021* (2013.01); *G01C 19/5733* (2013.01);
(Continued)

(58) Field of Classification Search
CPC .............. G01C 19/574; G01C 19/5755; G01C 19/5762; G01C 19/5719; G01C 19/5733
(Continued)

(56) References Cited

U.S. PATENT DOCUMENTS 8,794,067 B2 * 8/2014 Schmid ................ G01C 19/574
73/504.12
8,915,137 B2 * 12/2014 Classen .............. G01C 19/5755
73/504.12
(Continued)

FOREIGN PATENT DOCUMENTS

FR    2983574 A1    6/2013

*Primary Examiner* — Helen Kwok
(74) *Attorney, Agent, or Firm* — Muncy, Geissler, Olds & Lowe, P.C.

(57) ABSTRACT

An inertial sensor comprising a frame to which at least two seismic bodies are connected by resilient means so as to be movable in a suspension plane, and transducers to keep the seismic bodies vibrating and to determine a relative movement of the seismic bodies relative to one another, characterized in that the seismic bodies have a single shape and a single mass, and in that the seismic bodies comprise interlocking parts such that the seismic bodies are nested inside one another while being movable in the suspension plane relative to the other of the seismic bodies, with the seismic bodies having centers of gravity that coincide with one another. A method for manufacturing such a sensor.

9 Claims, 3 Drawing Sheets

(51) Int. Cl.
*G01C 19/5733* (2012.01)
*B81B 3/00* (2006.01)
*B81C 1/00* (2006.01)

(52) U.S. Cl.
CPC .. *G01C 19/5769* (2013.01); *B81B 2201/0242* (2013.01); *B81B 2201/0271* (2013.01); *B81B 2203/0109* (2013.01); *B81C 1/00547* (2013.01); *B81C 2201/013* (2013.01)

(58) Field of Classification Search
USPC .......................... 73/504.12, 504.14, 504.04
See application file for complete search history.

(56) References Cited

U.S. PATENT DOCUMENTS

| | | |
|---|---|---|
| 2011/0232384 A1 | 9/2011 | Akashi et al. |
| 2012/0125098 A1 | 5/2012 | Ohms et al. |

\* cited by examiner

INERTIAL SENSOR WITH NESTED SEISMIC MASSES AND METHOD FOR MANUFACTURING SUCH A SENSOR

BACKGROUND OF THE INVENTION

Field of the Invention

The present invention relates to an inertial sensor with vibrating masses, such as an angular sensor of the rate-gyro or free-gyro types.

Brief Discussion of the Related Art

Such an inertial sensor comprises a frame and seismic bodies (currently called seismic masses or test masses) which are generally positioned side by side and connected to the frame by means of elastic hinges so as to be movable in a suspension plane defined by two orthogonal directions of displacement of the seismic bodies. The elasticity of the hinges associated with the mass of the seismic bodies defines the frequencies of the own modes of the seismic bodies. The sensor also comprises actuators so arranged as to vibrate the seismic bodies and detectors so arranged as to detect movements relative to the seismic bodies.

The resonator composed of the seismic bodies and the elastic hinges has two vibration useful modes, which define two directions for the displacement of the seismic bodies. The detection of the vibration of the seismic bodies along such directions makes it possible to make an angular measurement.

The performances of such sensors are all the higher since the damping anisotropy of the resonator is stable. Such stability depends on the stability of the damping characteristics of the resonator and on the stability of the power transfers between the resonator and the outside. The damping anisotropy must be as stable as possible not to generate inaccuracy in the measurements made using the angular sensor.

Power transfers between the resonator and the outside depend on:
- the average damping (in connection with the time constant of the sensor) which must be as low as possible, in order to limit the power input required for maintaining a constant amplitude of the vibration and limit the inaccuracy of such power input,
- the balancing of the useful modes of vibration of the seismic bodies which must limit the reaction forces and torques on the frame for the useful modes and thus limit the power transfer to the outside, and, reversely, limit the sensitivity to the outside vibrating environment of the useful modes of vibration,
- the frequency plane of the seismic bodies which must have a significant difference between the frequency of the useful modes and the frequency of modes of vibration not operated for the measurement in order to limit the power transfers between such modes.

When the resonator comprises two seismic bodies positioned side by side, the resonator is balanced in translation on one of the two useful modes, for which the seismic bodies oscillate in phase opposition along the same axis but torques are generated by the other useful mode for which the seismic bodies oscillate in phase opposition along two distant and parallel axes. Such torques transmit efforts and thus power to the outside and vice versa the displacements of the seismic bodies are opposed by the torques generated in response to the angular displacement of the sensor carrier.

When the resonator comprises four seismic bodies positioned as a square, the resonator is totally balanced for the two own useful modes, but the frequency plane thereof is not optimum, since the vibration useful modes are close to not operated modes which may create power transfers with the two useful modes.

Various solutions have been proposed for improving the performances of the sensors like, for instance, in the document FR-A-2983574.

BRIEF SUMMARY OF THE INVENTION

One object of the invention is to provide means for improving the performances of the sensor.

For this purpose, the invention provides for an inertial sensor comprising a frame to which at least two seismic bodies are connected by resilient means so as to be movable in a suspension plane, and transducers to keep the seismic bodies vibrating and to determine a relative movement of the seismic bodies relative to one another, The seismic bodies have a single shape and a single mass, and the seismic bodies comprise interlocking parts such that the seismic bodies are nested inside one another while being movable in the suspension plane relative to the other of the seismic bodies, with the seismic bodies having centres of gravity that coincide with one another.

As the seismic bodies have a single shape and a single mass, and as the centres of gravity thereof coincide with one another, the seismic bodies have the same inertia and are subjected to the same influence from the external effects. This contributes to the balancing of the resonator for the two useful own modes and to the stability of the damping anisotropy.

The object of the invention is also a method for manufacturing such a sensor comprising the step of etching the sensor into a wafer comprising at least one electrically insulating layer between two layers of semi-conductor material so that the electrically insulating layer extends between the wings and the core of each seismic body.

Other characteristics and advantages of the invention will become apparent upon reading the following description of particular non-restrictive embodiments of the invention.

BRIEF DESCRIPTION OF THE DRAWINGS

Reference is made to the appended drawings, wherein.

DETAILED DISCUSSION OF THE PREFERRED EMBODIMENTS

Figure 1:
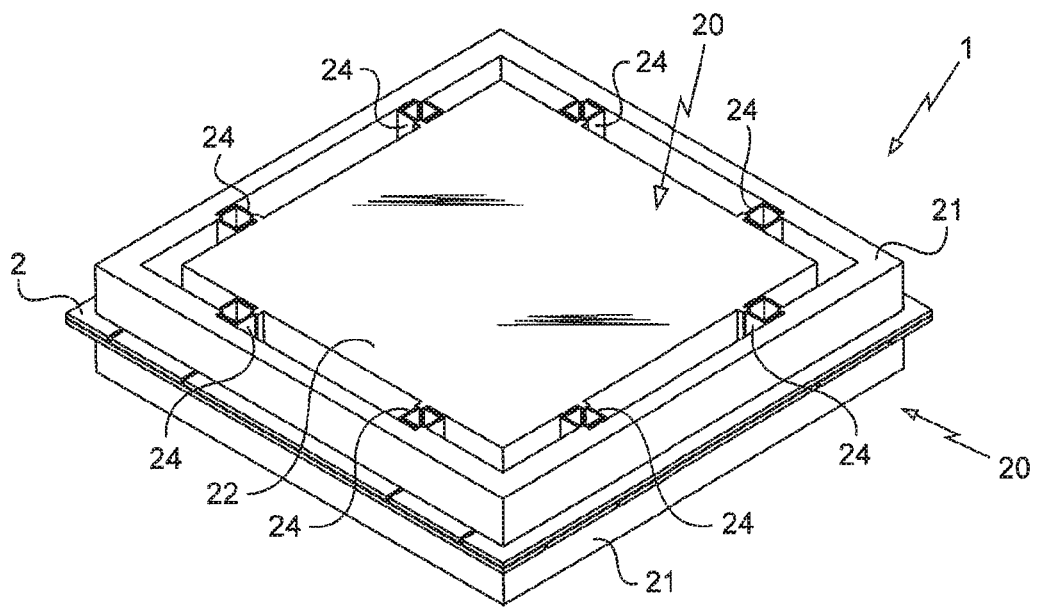
FIG. 1 is a perspective view of the sensor.
Figure 2:
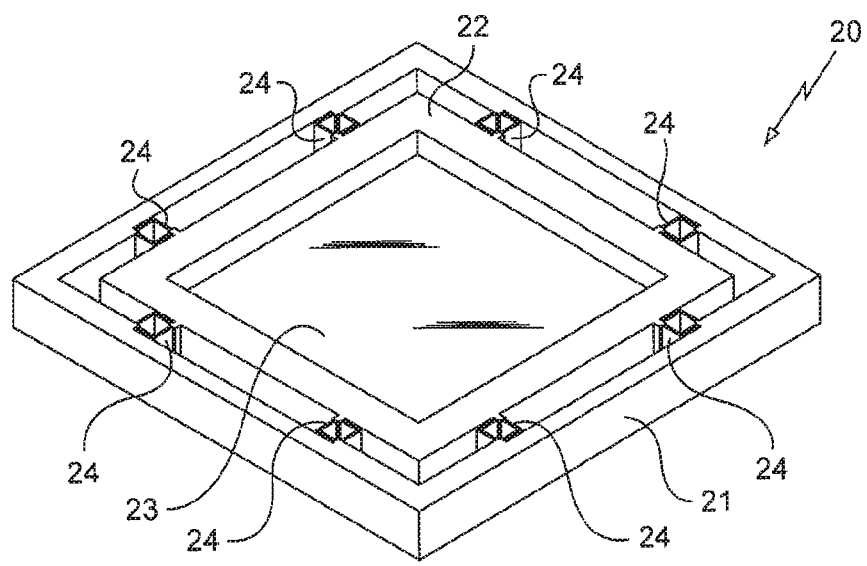
FIG. 2 is a perspective view of a part of the casing of the sensor.
Figure 3:
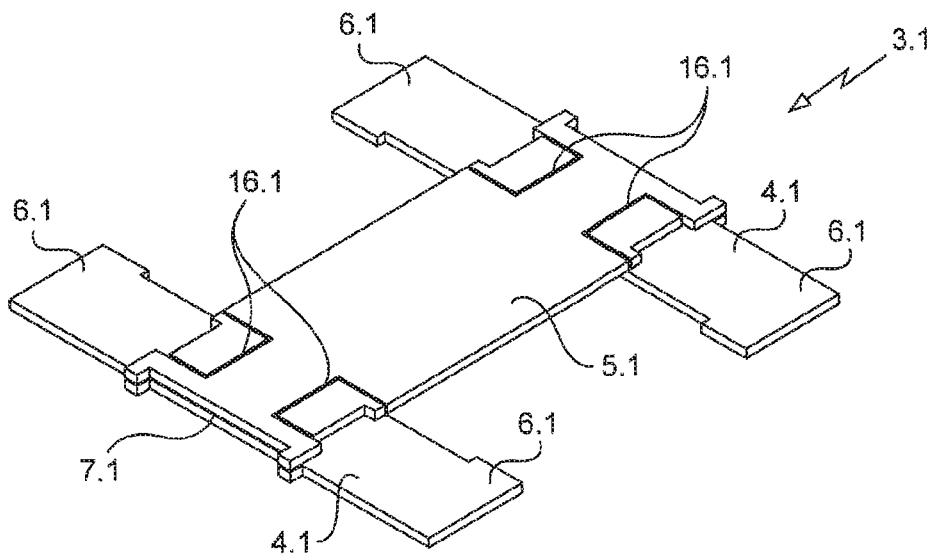
FIG. 3 is a perspective view of one of the seismic bodies of a sensor according to a first embodiment of the invention.
Figure 4:
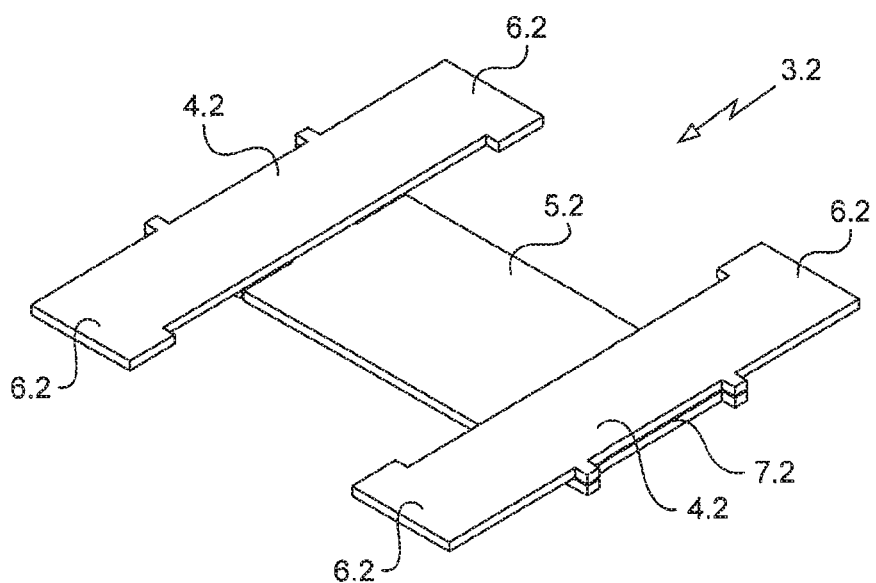
FIG. 4 is a view similar to FIG. 1, of the other of the seismic bodies of the sensor.
Figure 5:
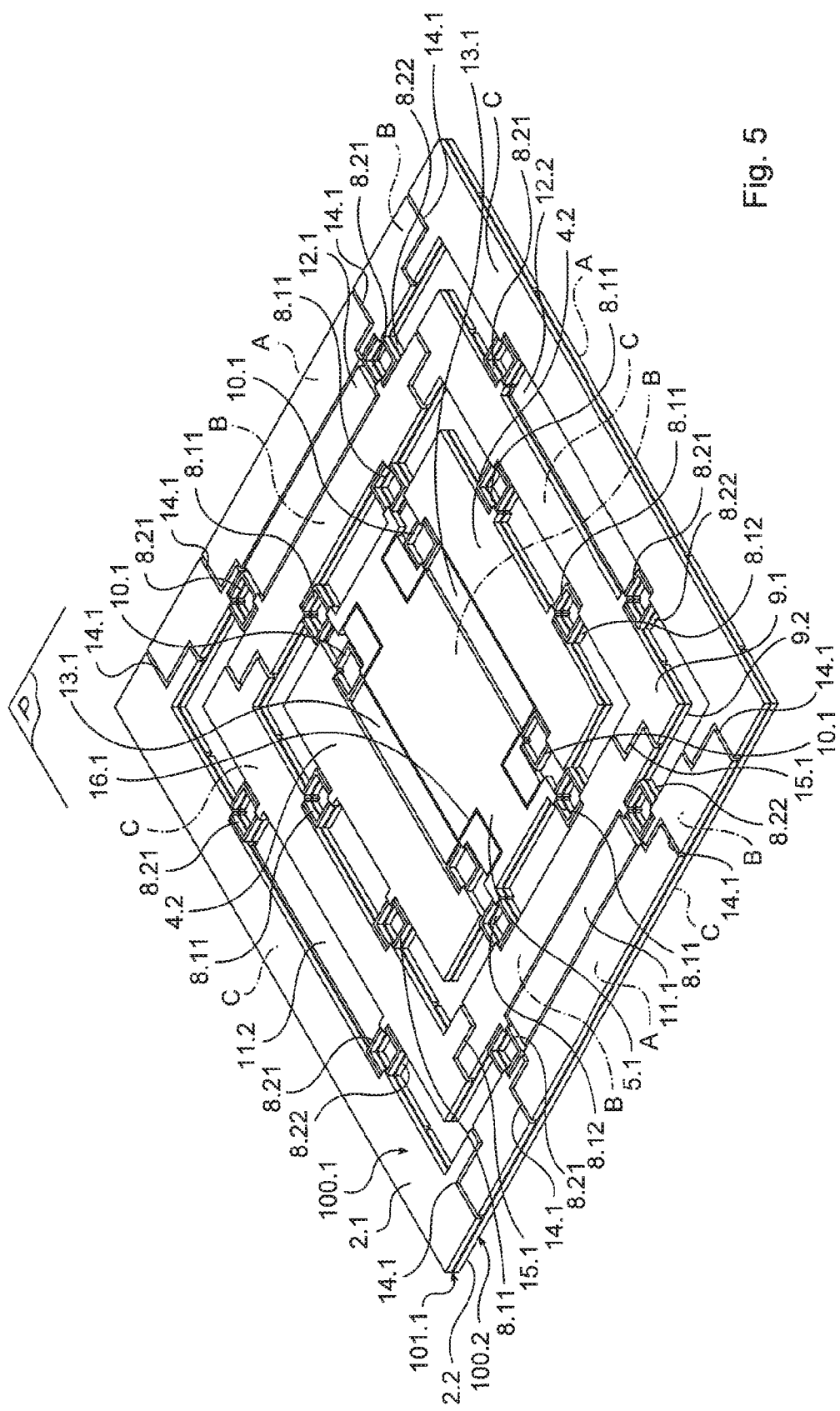
FIG. 5 is a perspective view of the sensor, without the casing.

While referring to the figures, the sensor according to the first embodiment of the invention, generally referred to by 1, is here a sensor of the MEMS (<<Micro Electro-Mechanical System>>) type and is made from a wafer comprising two semi-conductor layers 100.1, 100.2 and an electrically insulating layer 101.1. The insulating layer 101.1 extends between the first semi-conductor layer 100.1 and the second semi-conductor layer 100.2. The semi-conductor layers 100.1, 100.2 are made of a semi-conductor material, here silicon and the insulating layer 101.1 is made of silicon dioxide, such as $SiO_2$.

In each semi-conductor layer 100.1, 100.2 the following elements are formed:
- a frame 2.1, 2.2 forming an external framework;
- an intermediate framework 9.1, 9.2;
- portions of seismic bodies generally referred to by 3.1, 3.2;
- first resilient means 8.11, 8.12 connecting the seismic bodies 3.1, 3.2 to the intermediate framework 9.1, 9.2;
- second resilient means 8.21, 8.22 connecting the intermediate framework 9.1, 9.2 to the frame 2.1, 2.2;
- third resilient means 10.1, 10.2 (the resilient means 10.1 only are visible on the figures) connecting the portions of seismic bodies 3.1, 3.2 together;
- first transducers 11.1, 11.2 which extend between a first side of the frame 2.1, 2.2 and a first side of the intermediate framework 9.1, 9.2 opposite;
- second transducers 12.1, 12.2 which extend between a second side of the frame 2.1, 2.2 and a second side of the intermediate framework 9.1, 9.2 opposite, with the second side carrying the transducers 12.1 being opposite the first side carrying the transducers 11.1 and the second side carrying the transducers 12.2 being opposite the first side carrying the transducers 11.2;
- third transducers 13.1, 13.2 (the transducers 13.1 only are visible on the figures) extending between the portions of seismic bodies 3.1, 3.2;

Each seismic body 3.1, 3.2 respectively comprises two parallelepiped wings 4.1, 4.2 which extend parallel with one another away from each other and are connected together by a parallelepiped central core 5.1, 5.2 which extends back from the wings 4.1, 4.2. The central core 5.1, 5.2 has a width smaller than the spacing of the wings 4.1, 4.2. The wings 4.1 of the seismic body 3.1 are formed in the semi-conductor layer 100.2 and the central core 5.1 of the seismic body 3.1 is formed in the semi-conductor layer 100.1. The wings 4.2 of the seismic body 3.2 are formed in the semi-conductor layer 100.1 and the central core 5.2 of the seismic body 3.2 is formed in the semi-conductor layer 100.2. A portion 7.1, 7.2 of the insulating layer between 100.1, 100.2 extends between the wings 4.1, 4.2 and the core 5.1, 5.2 so as to electrically insulate the wings 4.1, 4.2 from the core 5.1, 5.2.

The seismic bodies 3.1, 3.2 are movable along a predetermined plane P. The seismic bodies 3.1, 3.2 have the same shape and the same mass. The seismic bodies 3.1, 3.2 are so positioned as to have centres of gravity that coincide with one another. Each wing 4.1, 4.2 has a mass equal to half the mass of the core 5.1, 5.2.

The semi-conductor layers 100.1, 100.2 are oriented at 90° with respect to one another about an axis normal to the predetermined plane P and at 180° about an axis of the predetermined plane P, so that the core 5.1, 5.2 of each seismic body 3.1, 3.2 extends opposite the core 5.1, 5.2 and between the wings 4.1, 4.2 of the other of the seismic bodies 3.1, 3.2. The wings 4.1, 4.2 of each of the seismic bodies 3.1, 3.2 thus have end portions 6.1, 6.2 which extend in the same plane as the core 5.2, 5.1 of the other of the seismic bodies 3.1, 3.2 and opposite end portions 6.2, 6.1 of the wings 4.2, 4.1 of the other of the seismic bodies 3.2, 3.1.

The seismic bodies 3.1, 3.2 thus comprise interlocking parts (the wings 4.1, 4.2) such that the seismic bodies 3.1, 3.2 are nested inside one another while being movable in the predetermined plane P relative to the other of the seismic bodies 3.2, 3.1.

The first resilient means 8.11, 8.12 and the second resilient means 8.21, 8.22 form a first suspension stage and a second suspension stage of the seismic bodies 3.1, 3.2.

The elastic means are here formed with blades elastically deformable parallel to the suspension plane P, but which have a high stiffness along the axis normal to the suspension plane to eliminate the degrees of freedom of the seismic bodies 3.1, 3.2 out of the suspension plane P. The elastic means 8.11, 8.12, 8.21, 8.22 are so arranged as to provide a relatively low coupling of the intermediate framework 9.1, 9.2 with the seismic bodies 3.1, 3.2 and with the frame 2.1, 2.2. The first elastic means 8.11, 8.12 have an isotropic stiffness in the plane P. The second elastic means 8.21, 8.22 have an isotropic stiffness in the plane P. The stiffness of the first elastic means 8.11, 8.12 and of the second elastic means 8.21, 8.22 is such that the frequency of the first own mode of the intermediate framework 9.1, 9.2 and of the own mode of the seismic bodies 3.1; 3.2 assembly is substantially lower than the frequency of the useful modes. The elastic means 10.1, 10.2 have an isotropic stiffness in the plane P and are so arranged as to provide a relatively high coupling of the seismic bodies 3.1; 3.2 together. The elastic means 10.1, 10.2 thus have a higher isotropic stiffness than that of the elastic means 8.11, 8.12, 8.21, 8.22.

Two elastic means 10.2 extend parallel to the central core 5.1 between each of the wings 4.1 of the seismic body 3.1 and the central core 5.2 of the seismic body 3.2 and two elastic means 10.1 extend parallel to the central core 5.2 between each one of the wings 4.2 of the seismic body 3.2 and the central core 5.1 of the seismic body 3.1.

The transducers 13 are connected to a control unit, not shown here, to determine the movement of the seismic bodies 3.1, 3.2 relative to one another.

The transducers 11.1, 11.2 are driven by the control unit so as to successively form on a first axis a detector of the relative displacement of the intermediate framework 9.1, 9.2 relative to the frame 2.1, 2.2 and a damping actuator of the first own vibration mode of the intermediate framework 9.1, 9.2 relative to the frame 2.1, 2.2.

The transducers 12.1, 12.2 are driven by the control unit so as to successively form on a second axis a detector of the relative displacement of the intermediate framework 9.1, 9.2 relative to the frame 2.1, 2.2 and a damping actuator of the first own vibration mode of the intermediate framework 9.1, 9.2 relative to the frame 2.1, 2.2.

The transducers 13.1, 13.2 are driven by the control unit so as to successively form an actuator vibrating the seismic bodies 3.1, 3.2 and a detector of the relative displacement of the seismic bodies 3.1, 3.2.

Two among the transducers 13.2 extend between each one of the wings 4.1 of the seismic body 3.1 and the central core 5.2 of the seismic body 3.2 and two among the transducers 13.1 extend between each one of the wings 4.2 of the seismic body 3.2 and the central core 5.1 of the seismic body 3.1. The transducers 13.1 are shaped as two, for instance comb-shaped, electrodes which, for each transducer, are integral, for the one with the wing 4.1, 4.2 and for the other one with the central core 5.2, 5.1. The electrodes are made in one piece with the wings 4.1, 4.2 and the central cores 5.1, 5.2. It should be noted that the portions 7.1, 7.2 of the insulating layer 101.1 make it possible to have wings 4.1, 4.2 and central cores 5.1, 5.2 with different potentials.

The semi-conductor layer 100.1, 100.2 comprises slots 14.1, 14.2 (only slots 14.1 are visible) on the first side and the second side of the frame 2.1, 2.2 so as to define a A zone opposite each transducer 11.1, 11.2; a B zone on either side of the A zone and opposite the second elements 8.21, 8.22 and a C zone between the two B zones.

The semi-conductor layer 100.1, 100.2 comprises slots 15.1, 15.2 (only slots 15.1 are visible) on the first side and the second side of the frame 9.1, 9.2 so as to define a B zone opposite each transducer 11.1, 11.2, the second resilient means 8.21, 8.22 and the first resilient means 8.11, 8.12, and a C zone between the two B zones.

The semi-conductor layer 100.1, 100.2 comprises slots 16.1, 16.2 around the third resilient means 10.1, 10.2 so as to define a B zone opposite the first resilient elements 8.21, 8.22 and the transducers 13.1, 13.2.

The transducers 11 and 12 each have an electrode integral with a B zone and an electrode integral with a A zone. The transducers 13 each have an electrode integral with a B zone and an electrode integral with a C zone. Here the electrodes are comb-shaped. As the slots 14, 15, extend over the whole height of the semi-conductor layer 100.1, 100.2, the A, B, C zones are electrically insulated and can be brought to different potentials to transmit control and/or detection signals. As the semi-conductor layers 100.1, 100.2 are spaced from each other by the insulating layer 101.1, the A, B, C zones of the semi-conductor layer 100.1 are electrically insulated from the A, B, C zones of the semi-conductor layer 100.2.

The A, B, C zones enable the conduction of a voltage signal between the transducers 11, 12, 13 and the periphery of the frame 2.1, 2.2. The control unit is electrically connected with the A, B, C zones at the periphery of the frame 2.1, 2.2.

In operation, the transducers 13 are driven so as to, alternately:
vibrate and keep vibrating the seismic bodies 3.1, 3.2 and resilient means 8.11, 8.12, 10.1, 10.2 assembly at the assembly resonance frequency;
detect the movements of the seismic bodies 3.1, 3.2 relative to each other.

The transducers 11, 12 are for instance so controlled as to create an adjustable electrostatic stiffness of the second suspension stage.

The sensor may comprise a casing composed of two parts generally referenced by 20 between which the frame 2.1, 2.2/intermediate frame 9.1, 9.2/seismic bodies 3.1, 3.2 assembly (and the transducers and the elastic means associated thereto) are trapped. Each part 20 comprises a frame 21 integral with the frame 1, and a lid 2 integral with the intermediate framework 9.1, 9.2 and connected with the framework 21 by elastic means 24. The lid 22 of each part 20 comprises a cavity 23 extending opposite the seismic bodies 3.1, 3.2. The lids 22 are so fastened to the support framework 9 that the cavity 23 can be held in a vacuum. The lid 22 has a sufficient mass to act as a recoil mass for the own modes of the seismic bodies 3.1, 3.2 3.1, 3.2 making it possible to separate the frequencies of the useful modes and the suspension mode created by the second elastic means 8.21, 8.22 and to attenuate at least a part of the parasitic loads from the outside.

As the seismic bodies have identical shapes and masses, and as the centres of gravity thereof coincide with one another, the seismic bodies have the same inertia and form a balanced resonator which transmits no power to the outside at the frequency of the useful modes and is subject to no influence by the effects of external vibrations. This contributes to the stability of the damping anisotropy, and the performances of the sensor are all the better since such anisotropy is stable.

The sensor according to the invention is at least partially obtained using a manufacturing method comprising a phase of etching a crystalline material.

The manufacturing method comprises the step of etching the sensor into the wafer comprising the two semi-conductor layers 100.1, 100.2 and the insulating layer 101.1.

The seismic bodies 3.1, 3.2 (the wings 4.1 and 4.2, the central cores 5.1 and 5.2, the insulating layers 7.1, 7.2), the frames 2.1, 2.2, the intermediate frameworks 9, the elastic means 8.11, 8.12, 8.21, 8.22, 10.1 and 10.2, the transducers 11.1, 11.2, 12.1, 12.2, 13.1, 13.2 and the slots 14, 15, 16 are directly obtained by etching.

Each part of the lid 20 is also obtained by etching a crystalline material.

Generally, the conventional MEMS technologies grouped under the generic name <<wafer bonding>> can also be used. In the present case, the so-called <<direct bonding>>, <<anodic bonding>> et <<metallic bonding>> techniques can be mentioned.

Of course, the invention is not limited to the described embodiments but encompasses any alternative solution within the scope of the invention as defined in the claims.

More particularly, the seismic bodies may have a shape different from the described one.

The transducers may not directly measure the relative movement of the seismic bodies 3.1 and 3.2 but the displacement of each seismic body relative to the support of the seismic bodies, with the relative movement then being the difference between the two displacements.

The sensor may not have a casing 20.

The sensor may have only one suspension stage.

The sensor may not be of the MEMS type for applications wherein the overall dimensions are not a constraint.

The electric connection of the transducers to the control unit may be provided without using conduction zones, for instance from conductive tracks or conductive wires added onto the semi-crystalline material.

As an alternative solution, the transducer 11.1 may be used as a detector only and the transducer 12.1 may be used as an actuator only, or reversely. The same goes for the transducers 11.2, 12.2.

The invention claimed is:

1. An inertial sensor, comprising:
   at least two seismic bodies;
   a frame to which the at least two seismic bodies are connected by resilient means so as to be movable in a suspension plane; and
   transducers to keep the seismic bodies vibrating and to determine a relative movement of the seismic bodies relative to one another,
   wherein the seismic bodies have a single shape and a single mass, the seismic bodies comprising interlocking parts such that the seismic bodies are nested inside one another while being movable in the suspension plane relative to the other of the seismic bodies, with the seismic bodies having centers of gravity that coincide with one another.

2. The sensor according to claim 1, wherein each seismic body comprises two parallelepiped wings which extend parallel with one another and are connected together by a parallelepiped central core which extends back from the wings, with the seismic bodies being oriented at 90° with respect to one another about an axis normal to the suspension plane and at 180° about an axis of the suspension plane, so that the core of each seismic body extends opposite the core and between the wings of the other of the seismic bodies and that the wings of each seismic body has end portions which extend in the same plane as the core and opposite end portions of the wings of the other of the seismic bodies.

3. The sensor according to claim 2, wherein each wing has a mass equal to half the mass of the core.

4. The sensor according to claim 1, wherein the seismic bodies are connected by first resilient means to a support framework connected to the frame by second resilient means to form a first suspension stage and a second suspension stage.

5. The sensor according to claim 1, wherein the transducers extend between the seismic bodies.

6. The sensor according to claim 2, wherein the seismic bodies are made of a semi-conductor material and an electrically insulating layer extends between the wings and the core so as to electrically insulate the wings from the core.

7. The sensor according to claim 6, wherein the semi-conductor material is silicon and the insulating layer is made of silicon dioxide.

8. The sensor according to claim 6, wherein the sensor is of the MEMS type.

9. A method for manufacturing a sensor according to claim 8, comprising the step of etching the sensor into a wafer comprising at least one electrically insulating layer between two layers of semi-conductor material so that the electrically insulating layer extends between the wings and the core of each seismic body.

* * * * *